(12) United States Patent
Kim et al.

(10) Patent No.: US 12,108,674 B2
(45) Date of Patent: Oct. 1, 2024

(54) PARALLEL THERMOELECTRIC MODULE

(71) Applicant: MI-SEOJIN, INC., Suwon-si (KR)

(72) Inventors: Seo Young Kim, Seoul (KR); Sung Hoon Park, Osan-si (KR); Keun Hee Lee, Suwon-si (KR); Dong Hyun Jang, Ansan-si (KR)

(73) Assignee: MI-SEOJIN, INC., Suwon-si (KR)

( * ) Notice: Subject to any disclaimer, the term of this patent is extended or adjusted under 35 U.S.C. 154(b) by 0 days.

(21) Appl. No.: 16/958,178

(22) PCT Filed: Apr. 9, 2018

(86) PCT No.: PCT/KR2018/004114
§ 371 (c)(1),
(2) Date: Sep. 29, 2020

(87) PCT Pub. No.: WO2019/132124
PCT Pub. Date: Jul. 4, 2019

(65) Prior Publication Data
US 2021/0074902 A1     Mar. 11, 2021

(30) Foreign Application Priority Data

Dec. 29, 2017   (KR) ........................ 10-2017-0184214
Mar. 12, 2018   (KR) ........................ 10-2018-0028684

(51) Int. Cl.
*H10N 10/17*      (2023.01)

(52) U.S. Cl.
CPC ................. *H10N 10/17* (2023.02)

(58) Field of Classification Search
CPC ......... H01L 35/04; H01L 35/10; H01L 35/32; H10N 10/17
See application file for complete search history.

(56) References Cited

U.S. PATENT DOCUMENTS

| 4,497,973 A | * | 2/1985 | Heath | ............. | H01L 35/10 |
|---|---|---|---|---|---|
| | | | | | 136/212 |
| 2011/0048486 A1 | * | 3/2011 | Sensui | ............. | H01L 35/08 |
| | | | | | 136/203 |
| 2016/0233402 A1 | * | 8/2016 | Suda | ............. | H10N 10/81 |

FOREIGN PATENT DOCUMENTS

| JP | 3613237 | | 1/2005 | | |
|---|---|---|---|---|---|
| JP | 2005136240 A | * | 5/2005 | ............. | H01L 35/16 |

(Continued)

OTHER PUBLICATIONS

JP-2005136240-A, machine translation, May 2005 (Year: 2005).*
(Continued)

*Primary Examiner* — Tamir Ayad
(74) *Attorney, Agent, or Firm* — PnK IP LLC

(57) ABSTRACT

A parallel thermoelectric module includes: first and second substrates spaced apart from each other; a plurality of first electrodes disposed on the first substrate; a plurality of second electrodes disposed on the second substrate; thermoelectric devices disposed in the first and second substrates to connect one of the first electrodes with one of the second electrodes and including a plurality of P and N type thermoelectric devices; electrode terminals including at least one positive electrode terminal and at least one negative electrode terminal disposed in at least one of the first and second substrates; and N parallel circuit units (N is a natural number of 2 or more) having an electrically parallel structure to each other in series. The plurality of first electrodes, the plurality of second electrodes, and the thermoelectric devices are arranged to connect N parallel circuit units.

8 Claims, 15 Drawing Sheets

(56) References Cited

FOREIGN PATENT DOCUMENTS

| JP | 2013-161973 | 8/2013 |
| KR | 10-2012-0009161 | 2/2012 |
| KR | 10-2013-0066314 | 6/2013 |
| KR | 10-1428613 | 8/2014 |

OTHER PUBLICATIONS

International Search Report mailed Sep. 12, 2018, in International Application No. PCT/KR2018/004114 (with English Translation).

* cited by examiner

N-type   P-type

Fig. 11

| | | Number of pellets | Z | R | V | I | W | Cool | Ta | ΔT |
|---|---|---|---|---|---|---|---|---|---|---|
| Mass production | Series type | 100 | 220 | 2 | 1.33 | 6 | 3.3 | 19.8 | 14.7 | 19.8 | -5.1 |
| Development | Series and parallel type | 100 | 220 | 1.61 | 0.52 | 5 | 7.3 | 36.5 | 14.3 | 19.2 | -4.9 |
| | | | | | | 4 | 5.9 | 23.6 | 14.3 | 19.3 | -5 |
| | | | | | | 3 | 4.5 | 13.5 | 14.7 | 19.2 | -4.5 |
| | | | | | | 2 | 3 | 6 | 15.6 | 19.2 | -3.6 |
| | | 95 | 210 | 1.54 | 0.55 | 5 | 7.2 | 36 | 15 | 19.8 | -4.8 |
| | | | | | | 4 | 5.9 | 23.6 | 14.8 | 19.8 | -4.9 |
| | | | | | | 3 | 4.5 | 13.5 | 15.4 | 19.8 | -4.4 |
| | | | | | | 2 | 3 | 6 | 16.3 | 19.9 | -3.6 |

Fig. 14

| | | Number of pellets | Z | R | V | I | W | Cool | Ta | ΔT |
|---|---|---|---|---|---|---|---|---|---|---|
| Mass production | Series type | 100 | 220 | 2 | 1.33 | 6 | 3.3 | 19.8 | 15.9 | 21 | -5.1 |
| Development | Series and parallel type | 100 | 220 | 1.54 | 0.49 | 5 | 8.8 | 44 | 15.1 | 20.9 | -5.8 |
| | | | | | | 4 | 7.1 | 28.4 | 15.1 | 20.9 | -5.8 |
| | | | | | | 3 | 5.4 | 16.2 | 15.8 | 20.9 | -5.1 |
| | | | | | | 2 | 3.6 | 7.2 | 17 | 20.9 | -3.9 |
| | | 75 | 166(-54) | 1.11 | 0.67 | 5 | 6.6 | 33 | 16.0 | 20.7 | -4.1 |
| | | | | | | 4 | 5.4 | 21.6 | 16.1 | 20.7 | -4.6 |
| | | | | | | 3 | 4.1 | 12.3 | 16.5 | 20.7 | -4.2 |
| | | | | | | 2 | 2.8 | 5.6 | 17.1 | 20.7 | -3.6 |

PARALLEL THERMOELECTRIC MODULE

CROSS-REFERENCE TO RELATED APPLICATIONS

This application is a National Stage Entry of International Application No. PCT/KR2018/004114, filed on Apr. 9, 2018, and claims priority from and the benefit of Korean Patent Application No. 10-2017-0184214, filed on Dec. 29, 2017, and Korean Patent Application No. 10-2018-0028684, filed on Mar. 12, 2018, each of which is hereby incorporated by reference for all purposes as if fully set forth herein.

BACKGROUND

Field

Exemplary implementations of the invention relate generally to a parallel thermoelectric module and, more specifically, to a parallel thermoelectric module having parallel circuits electrically connected in parallel so that thermoelectric elements may generate a plurality of current paths, or a thermoelectric module having a plurality of parallel circuits connected in series.

Discussion of the Background

A thermoelectric module is used for power generation or cooling using a Seeback effect or a Peltier effect.

The thermoelectric module is used to generate power using the Seeback effect, which is a phenomenon of generating electromotive force when there is a difference in temperature between two ends thereof, or contrarily, the thermoelectric module is used to make cooling or heating devices using current through the Peltier effect of cooling one end thereof and heating the other end thereof as heat moves along electric charges when electric current is applied to both ends thereof.

Particularly, when the thermoelectric module is used as a cooling device, cooling efficiency is lower than that of a conventional cooling device using a refrigerant. However, since the thermoelectric module does not generate mechanical noise and is relatively easy to control temperature and eco-friendly, it may be often used for home appliances or vehicle sheets that do not require a very low cooling temperature.

RELATIVE DOCUMENTS

Korean Public Patent Application (No. 10-2010-0075341, "Thermoelectric module including heat-sensitive switch")

Korean Public Patent Application (No. 10-2016-0065048, "Thermoelectric conversion module").

The above information disclosed in this Background section is only for understanding of the background of the inventive concepts, and, therefore, it may contain information that does not constitute prior art

SUMMARY

Applicant has discovered that a thermoelectric module has a problem in that the entire thermoelectric module does not operate even when a defect or a bonding failure occurs in a small number of thermoelectric elements due to the characteristic that a plurality of thermoelectric elements is electrically connected in series.

Parallel thermoelectric modules according to exemplary embodiments of the invention are capable of addressing the above problems, and providing remarkably lower the defect rate of the thermoelectric module itself, although a defect (of a thermoelectric element itself or a bonding defect) occurs in the thermoelectric elements included in the thermoelectric module and current does not flow through a corresponding group of defective thermoelectric elements, by flowing current through thermoelectric elements belonging to different groups.

Additional features of the inventive concepts will be set forth in the description which follows, and in part will be apparent from the description, or may be learned by practice of the inventive concepts.

According to one aspect of the invention, there is provided a parallel thermoelectric module comprising: a first substrate and a second substrate arranged to be spaced apart from each other; a plurality of first electrodes formed on the first substrate; a plurality of second electrodes formed on the second substrate; thermoelectric elements formed on the first substrate and the second substrate to connect any one of the first electrodes to any one of the second electrodes, and including a plurality of N-type thermoelectric elements and a plurality of P-type thermoelectric elements; and electrode terminals including at least one positive electrode terminal and at least one negative electrode terminal formed on at least one of the substrates, wherein the first electrodes, the second electrodes, and the thermoelectric elements are arranged to connect N parallel circuit units (N is a natural number of 2 or more) having an electrically parallel structure to each other in series.

In addition, a first parallel circuit unit of at least one of the parallel circuit units may include a plurality of current paths, wherein at least one first electrode, at least one second electrode, and at least one thermoelectric element may be provided in each of the current paths, and current sequentially may flow through the at least one first electrode, the at least one thermoelectric element, and the at least one second electrode when power is applied through the electrode terminals.

In addition, the first parallel circuit unit may include at least one common electrode through which current flowing through each of the current paths commonly passes.

In addition, a second parallel circuit unit connected to the first parallel circuit unit in series may be directly connected through the common electrode.

In addition, the first parallel circuit unit may include: a first immediately-before heterogeneous electrode connecting the common electrode and a first immediately-before homogeneous electrode included in a first current path among the current paths; and a second immediately-before heterogeneous electrode connecting the common electrode and a second immediately-before homogeneous electrode included in a second current path among the current paths, wherein the first immediately-before heterogeneous electrode and the second immediately-before heterogeneous electrode may be the same electrode or connected to contact each other.

In addition, each of the first immediately-before heterogeneous electrode and the second immediately-before heterogeneous electrode may be connected to the common electrode through one thermoelectric element.

In addition, the common electrode may be connected to each of a first immediately-before heterogeneous electrode connecting the common electrode and a first immediately-before homogeneous electrode included in a first current path among the current paths included in the first parallel circuit unit; a second immediately-before heterogeneous electrode connecting the common electrode and a second immediately-before homogeneous electrode included in a second current path among the current paths included in the first parallel circuit unit; a first immediately-after heterogeneous electrode connecting the common electrode and a first immediately-after homogeneous electrode included in a third current path among the current paths included in the second parallel circuit unit; and a second immediately-after heterogeneous electrode connecting the common electrode and a second immediately-after homogeneous electrode included in a fourth current path among the current paths included in the second parallel circuit unit.

According to another aspect of the invention, there is provided a parallel thermoelectric module comprising: a first substrate and a second substrate arranged to be spaced apart from each other; a plurality of first electrodes formed on the first substrate; a plurality of second electrodes formed on the second substrate; and thermoelectric elements formed on the first substrate and the second substrate to connect any one of the first electrodes to any one of the second electrodes, and including a plurality of N-type thermoelectric elements and a plurality of P-type thermoelectric elements, wherein the first parallel circuit unit and the second parallel circuit unit having a plurality of current paths are directly connected in series through any one electrode.

According to another aspect of the invention, there is provided a parallel thermoelectric module comprising: a first substrate and a second substrate arranged to be spaced apart from each other; a plurality of first electrodes formed on the first substrate; a plurality of second electrodes formed on the second substrate; and thermoelectric elements formed on the first substrate and the second substrate to connect any one of the first electrodes to any one of the second electrodes, and including a plurality of N-type thermoelectric elements and a plurality of P-type thermoelectric elements, wherein the thermoelectric module includes: at least one parallel circuit unit having a plurality of current paths; and at least one common electrode through which current flowing through each of the current paths commonly passes.

According to another aspect of the invention, there is provided a parallel thermoelectric module comprising: a first substrate and a second substrate arranged to be spaced apart from each other; a plurality of first electrodes formed on the first substrate; a plurality of second electrodes formed on the second substrate; and thermoelectric elements formed on the first substrate and the second substrate to connect any one of the first electrodes to any one of the second electrodes, and including a plurality of N-type thermoelectric elements and a plurality of P-type thermoelectric elements, wherein the first parallel circuit unit and the second parallel circuit unit having a plurality of current paths are directly connected in series through any one common electrode, and the common electrode is connected to each of a first immediately-before heterogeneous electrode, a second immediately-before heterogeneous electrode, a third immediately-before heterogeneous electrode, and a fourth immediately-before heterogeneous electrode.

According to another aspect of the invention, there is provided a parallel thermoelectric module comprising: a first substrate and a second substrate arranged to be spaced apart from each other; a plurality of first electrodes formed on the first substrate; a plurality of second electrodes formed on the second substrate; thermoelectric elements formed on the first substrate and the second substrate to connect any one of the first electrodes to any one of the second electrodes, and including a plurality of N-type thermoelectric elements and a plurality of P-type thermoelectric elements; and electrode terminals including at least one positive electrode terminal and at least one negative electrode terminal formed on at least one of the substrates, wherein the thermoelectric module includes: at least one parallel circuit unit having a plurality of current paths; and each of the current paths includes at least one first electrode, at least one second electrode, and at least one thermoelectric element.

According to the exemplary embodiment, there is an effect of maintaining operation of the thermoelectric module itself by flowing current through thermoelectric elements belonging to a current path other than a current path including a defective thermoelectric element although there is a defect (a defect of a thermoelectric element or a bonding defect) in a plurality of thermoelectric elements included in the thermoelectric module.

In addition, by providing a plurality of parallel circuits configured of a first electrode, a second electrode, and thermoelectric elements formed between two substrates is provided, and the parallel circuits are connected in series, there is an effect of lowering degradation of performance, although any one thermoelectric element is defective (or a thermoelectric element is poorly bonded), by relatively reducing the number of thermoelectric elements included in a current path including the defective thermoelectric element.

In addition, according to an embodiment, there is an effect of heating or cooling relatively evenly by other groups, although a certain group does not operate, as thermoelectric elements belonging to each group are relatively evenly distributed in the thermoelectric module.

In addition, according to an embodiment, there is an effect of reducing changes in the process or configuration of a conventional thermoelectric module, by allowing to use only two electrode terminals to which lead wires are connected.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

A brief description of each drawing is provided to further sufficiently understand the drawings cited in the detailed description of the present invention.

FIG. 11 is a table showing a performance of an experimental example of the thermoelectric module shown in FIG. 8.

FIG. 14 is a table showing a performance of an experimental example of the thermoelectric module shown in FIG. 12.

DETAILED DESCRIPTION

To fully understand the present invention, the operational advantages of the present invention, and the objects achieved by the embodiments of the present invention, reference should be made to the accompanying drawings and the contents described in the accompanying drawings, which illustrate preferred embodiments of the present invention.

The terms used in this specification are only used to describe specific embodiments, and are not intended to limit the present invention. Singular expressions include plural expressions unless the context clearly indicates otherwise.

In addition, it should be understood that in this specification, the terms such as 'include' or 'have' are intended to specify the presence of features, numbers, steps, operations, components, parts, or combinations thereof described in the specification, and do not preclude in advance the possibility of presence or addition of one or more other features, numbers, steps, operations, components, parts or combinations thereof.

Hereinafter, the present invention is described in detail focusing on the embodiments of the present invention with reference to the attached drawings. Like reference symbols presented in each drawing denote like members.

Figure 1:
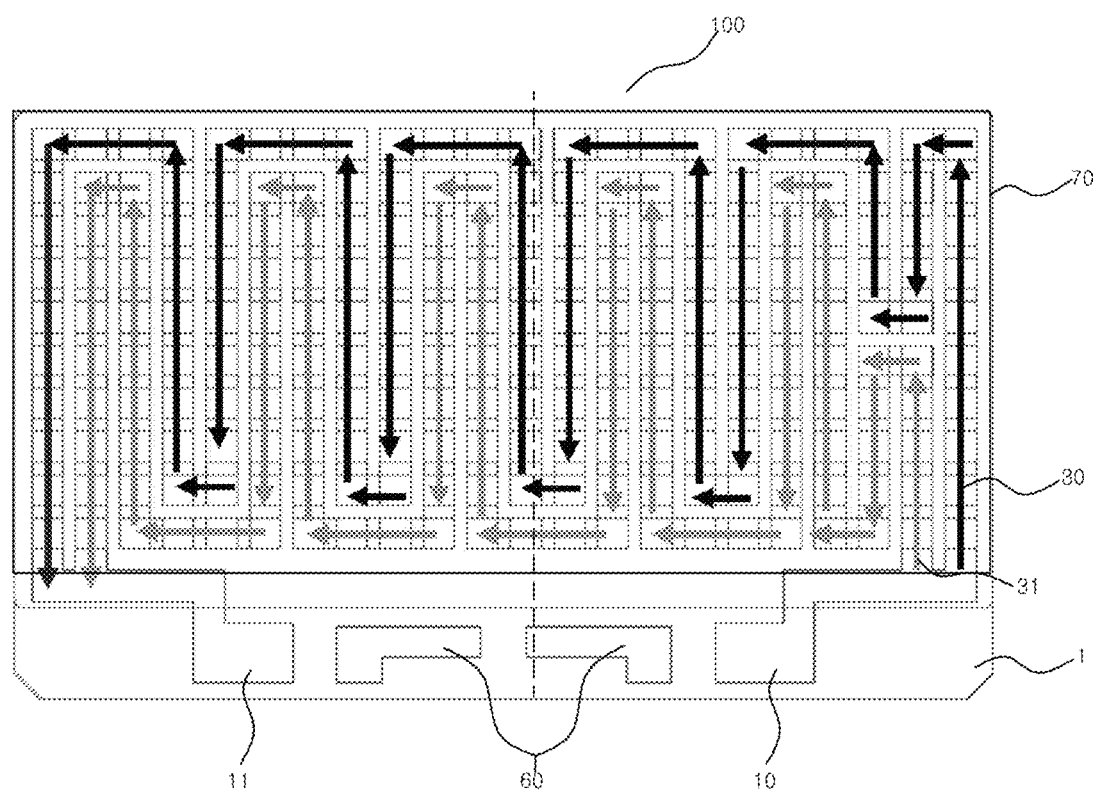
FIG. 1 is a plan view showing current paths of an exemplary embodiment of a parallel thermoelectric module constructed according to the principles of the invention.

FIG. 1 is a plan view showing current paths of an exemplary embodiment of a parallel thermoelectric module constructed according to the principles of the invention.

FIG. 1 shows a parallel thermoelectric module 100 according to the exemplary embodiment, in which a parallel circuit unit having two current paths is formed.

However, exemplary embodiments are not limited thereto. For example, one parallel circuit unit may have three or more current paths. In addition, the thermoelectric module 100 may be provided with a plurality of parallel circuit units as described below. In this case, the parallel circuit units may be connected to each other in series.

Each current path may be a path of electric current alternatingly flowing along a first electrode, a thermoelectric element, and a second electrode, like a conventional thermoelectric module.

Referring to FIG. 1, the parallel thermoelectric module 100 according to an exemplary embodiment has a plurality of current paths 30 and 31 as shown in FIG. 1.

Each of the current paths 30 and 31 may be provided with a first electrode, a second electrode, and thermoelectric elements.

The first electrode may be an electrode formed on a first substrate (e.g., a lower substrate) to which different types of thermoelectric elements are bonded.

The second electrode may be an electrode formed on a second substrate (e.g., an upper substrate) to which different types of thermoelectric elements are bonded.

In addition, the first electrode and the second electrode may be electrically connected through a thermoelectric element.

For example, the first current path 30 and the second current path 31 are electrically connected in parallel.

Further, the components (e.g., first electrode, second electrode, and thermoelectric element) included in each current path may be connected to each other in series as shown in FIG. 1.

Accordingly, for example, when a fault occurs in a thermoelectric element belonging to one of current paths, current does not pass through the one of the current paths, but current normally flows through the other ones of the current paths. In this specification, the defect of a thermoelectric element may include a bonding defect between a thermoelectric element and a metal electrode (e.g., a first electrode or a second electrode), as well as a defect of the thermoelectric element itself.

As a result, according to the exemplary embodiment, there is an effect of remarkably lowering the defective rate of the thermoelectric module, compared with the case where the entire thermoelectric module does not operate properly by only defective one of the thermoelectric elements since all the thermoelectric elements included in the thermoelectric module are electrically connected in series.

According to the exemplary embodiment, when the defect rate of the thermoelectric module is statistically 1/1000 in the process of manufacturing the thermoelectric module, and when at least one thermoelectric element in a defective thermoelectric module is determined to be defective, the thermoelectric module itself may be determined to be defective by a fault occurred in each of the thermoelectric elements in any one thermoelectric module or by the plurality of defective thermoelectric elements included in different groups. Accordingly, there is an effect of abruptly lowering the defective rate of the thermoelectric module to one millionth or lower in practice.

A more specific configuration of the parallel thermoelectric module 100 will be described with reference to FIGS. 2 and 3.

Figure 2:
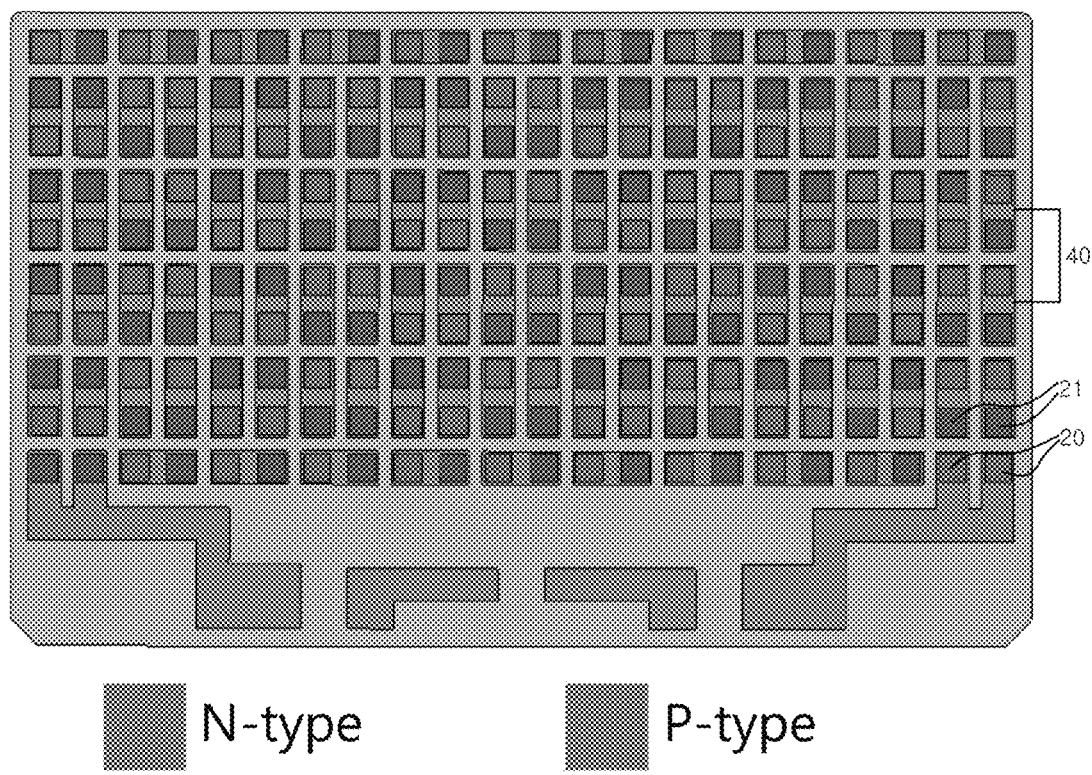
FIG. 2 and FIG. 3 are a plan view and a perspective view of the parallel thermoelectric module of FIG. 1, respectively.
Figure 2:
Figure 2:
Figure 3:
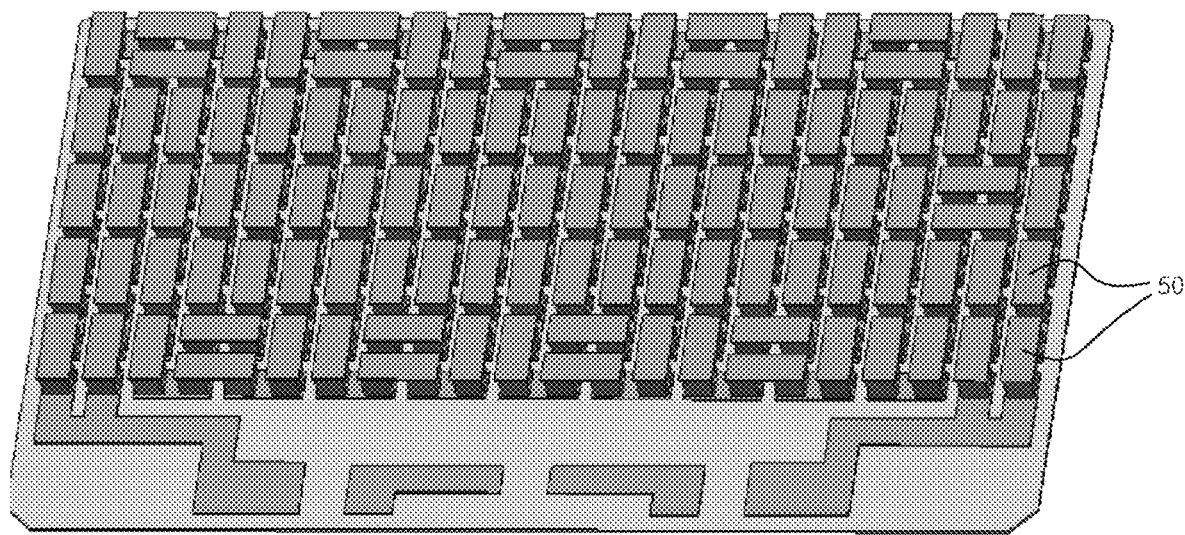

Referring to FIGS. 1 to 3, substrates (e.g., the lower substrate 1 of FIG. 1 and the upper substrate), thermoelectric elements 20 and 21 arranged between the substrates, metal electrodes (e.g., a metal electrode 40 of the lower substrate and a metal electrode 50 of the upper substrate) electrically connecting the thermoelectric elements, and electrode terminals 10 and 11 connected to lead wires may be provided to implement the parallel thermoelectric module 100.

Each of the thermoelectric elements 20 and 21 may be classified as a P-type thermoelectric element 20 or an N-type thermoelectric element 21. In addition, the metal electrodes 40 and 50 may be bonded by the different types of thermoelectric elements.

FIG. 2 shows a case in which thermoelectric elements are arranged on the lower substrate 1 of the parallel thermoelectric module 100, and FIG. 3 shows the electrical connection state when the metal electrode terminal 50 is formed on the upper substrate.

When DC power is supplied to the electrode terminals 10 and 11 through the thermoelectric elements 20 and 21 and the metal electrodes 40 and 50 of FIG. 3, a plurality of current paths may be formed as shown in FIG. 1.

For example, the parallel thermoelectric module 100 may further include a switch connection unit 60 for connecting a temperature switch for safety, and since the configuration of the temperature switch has been disclosed in detail in the prior patent documents described above, detailed description thereof will be omitted.

The plurality of current paths may have a path as shown in FIG. 1, but, exemplary embodiments are not limited thereto. For example, the plurality of current paths may have various paths depending on arrangement of the thermoelectric elements and the metal electrodes. In addition to a case of providing only two electrode terminals (e.g., one positive electrode terminal 10 and one negative electrode terminal 11) as the electrode terminals 10 and 11 are provided as shown in FIG. 1, but exemplary embodiments are not limited thereto. For example, examples thereof are shown in FIGS. 4, 5, and 6.

Figure 4:
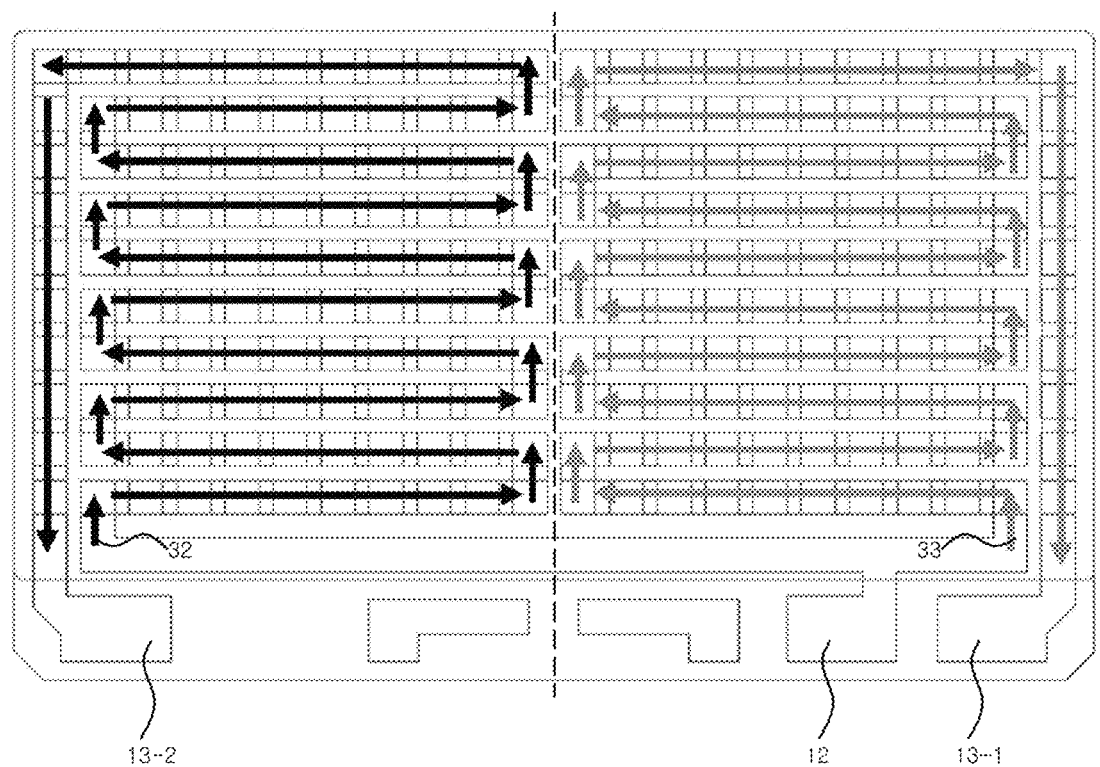
FIG. 4, FIG. 5 and FIG. 6 are plan views of other exemplary embodiments of the parallel thermoelectric module of FIG. 1.
Figure 5:
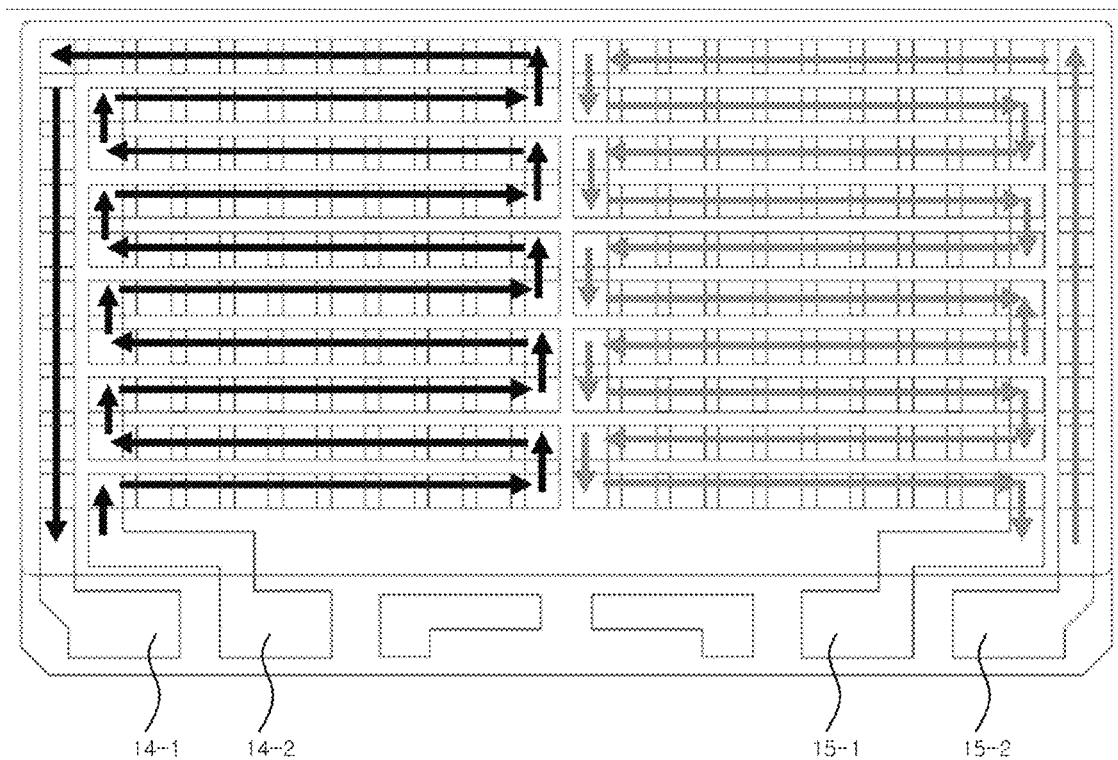
Figure 6:
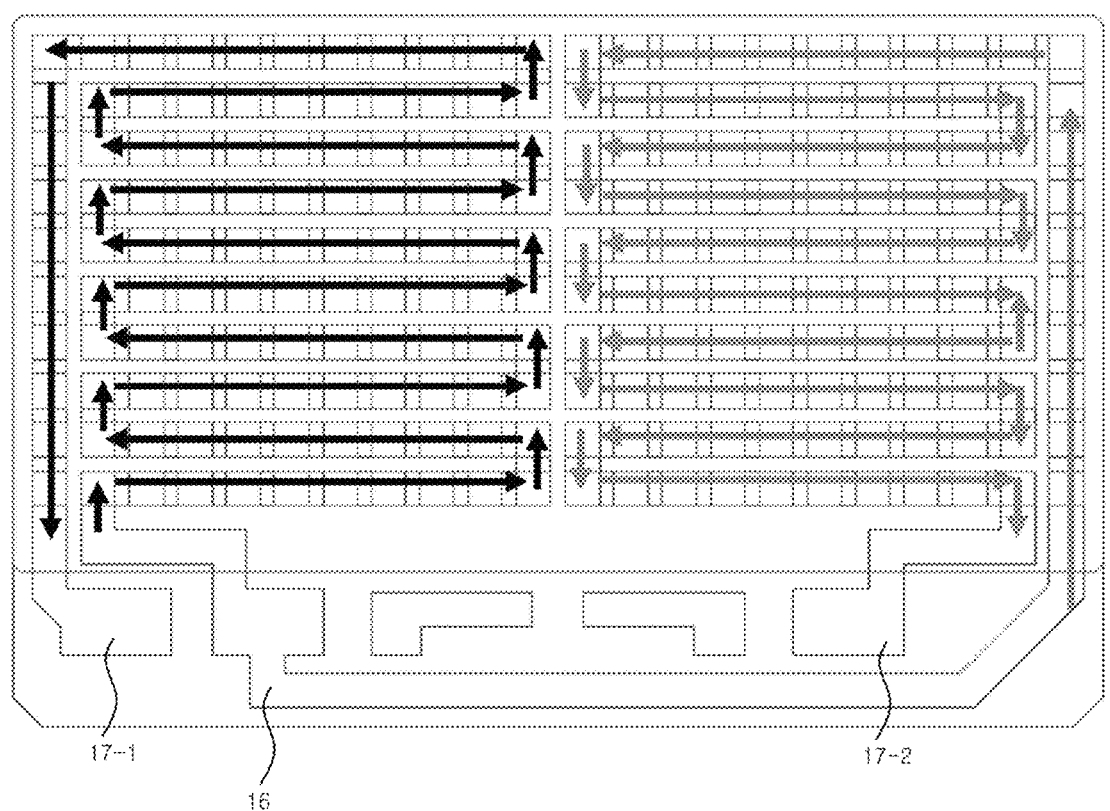

FIGS. 4, 5, and 6 are plan views of other exemplary embodiments of the parallel thermoelectric module of FIG. 1.

First, referring to FIG. 4, the parallel thermoelectric module 100 shown in FIG. 4 may have two current paths 32 and 33 as shown in the figure.

In addition, the parallel thermoelectric module 100 may be provided with one positive electrode terminal 12 and first and second negative electrode terminals 13-1 and 13-2. In addition, a first current path is formed between the positive electrode terminal 12 and the first negative electrode terminal 13-1, and a second current path may be formed between the positive electrode terminal 12 and the second negative electrode terminal 13-2.

In addition, it can be understood that in the parallel thermoelectric module 100 of FIG. 4, the arrangement area of the thermoelectric elements (e.g., the area where the thermoelectric elements and the metal electrodes are arranged) is divided into two subareas in a predetermined first direction (e.g., a horizontal direction), and only the parts (e.g., thermoelectric elements, and metal electrodes) belonging to any one current path are arranged in each of the divided subareas. The subareas are not necessarily divided in the same size, and may be divided to have a difference within a predetermined range (e.g., 10%, 20%, etc.) in the number of included thermoelectric elements.

When there are N current paths (N is a natural number of 2 or more) as described above, N different subareas are divided on the basis of the first direction, and when only the parts belonging to any one current path are arranged in each of the subareas, it may be easy to arrange the thermoelectric elements and/or design the metal electrode terminals. However, when only one of the current paths operates as described below, there may be a problem in that heating and/or cooling performance is exhibited only in any one portion of the thermoelectric module.

For example, unlike the thermoelectric module shown in FIG. 4, FIG. 5 shows a case in which the parallel thermoelectric module 100 has first and second positive electrode terminals 14-2 and 15-2 and first and second negative electrode terminals 14-1 and 15-1.

For example, the first current path may be formed between the first positive electrode terminal 14-2 and the first negative electrode terminal 14-1, and the second current path may be formed between the second positive electrode terminal 15-2 and the second negative electrode terminal 15-1.

In addition, the parallel thermoelectric module 100 shown in FIG. 6 is an example of implementing arrangement of the electrode terminals to be different from that of FIG. 4, and is provided with one positive electrode terminal 16 and first and second negative electrode terminals 17-1 and 17-2. In addition, the first current path may be formed between the positive electrode terminal 16 and the first negative electrode terminal 17-1, and the second current path may be formed between the positive electrode terminal 16 and the second negative electrode terminal 17-2.

In addition, rather than dividing the subareas, which are divided on the basis of the first direction (e.g., the horizontal direction) as shown in FIGS. 4, 5, and 6, to include only the parts belonging to the same current path, the first current path and the second current path may be evenly distributed across the entire arrangement area of the thermoelectric module as shown in FIG. 1, while having an exemplary embodiment of the electrode terminals as shown in FIGS. 4, 5, and 6.

For example, although N subareas are divided in the first direction (e.g., the horizontal direction) of the arrangement area 70, in which thermoelectric elements are arranged, as shown in FIG. 1, all the parts included in the first current path may be arranged in the N subareas, and all the parts included in the second current path may also be arranged in the N subareas.

In addition, although the number and arrangement of electrode terminals may vary as described above, in the case of a conventional thermoelectric module, all the thermoelectric elements are connected in series, and in this case, since it is general that only two electrode terminals are provided as shown in FIG. 1, when only two electrode terminals are provided, there is an effect of simplifying additional processes or changing configurations in comparison with a conventional manufacturing process.

In addition, it may be more effective to evenly distribute the parts belonging to any one current path across the arrangement area 70 as shown in FIG. 1. Thus, in this case, heating or cooling performance may evenly generate in all the thermoelectric elements.

Contrarily, when thermoelectric elements belonging to a specific current path are concentratedly arranged in a specific area as shown in FIGS. 4, 5, and 6 and only a corresponding current path operates, heating or cooling performance is exhibited only in the specific area, and although the performance may be degraded slightly, there may be a convenience in the manufacturing process, such as forming a pattern of the metal electrode.

Figure 7:
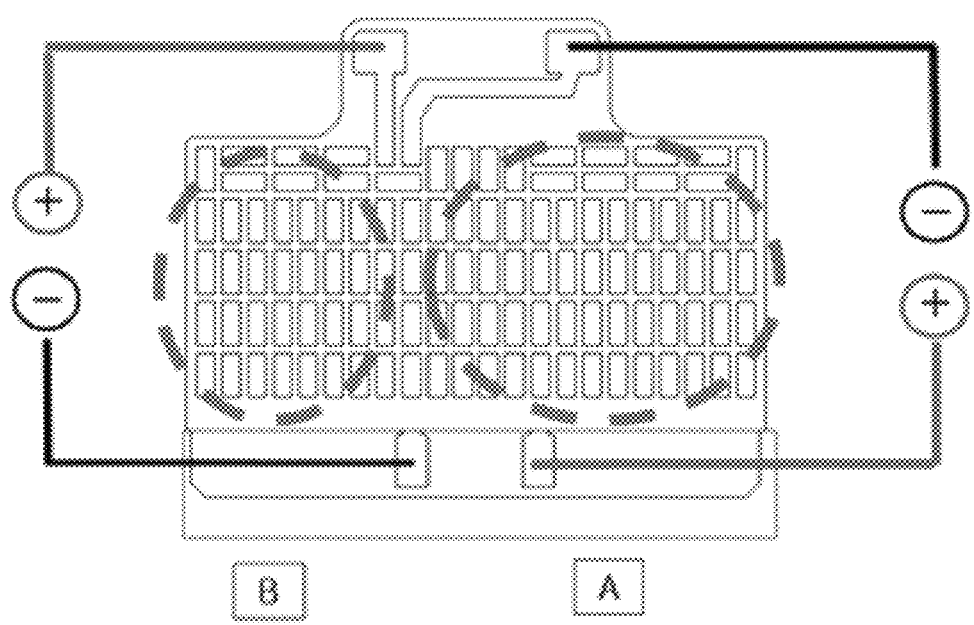
FIG. 7 is a plan view of an experimental example of the exemplary embodiments of the parallel thermoelectric module of FIG. 1.

FIG. 7 is a plan view illustrating an experimental example of exemplary embodiments of the parallel thermoelectric module of FIG. 1.

Referring to FIG. 7, an experiment is performed by measuring cold air discharged from the parallel thermoelectric module to test performance of the parallel thermoelectric module to which the exemplary embodiment is applied.

A conventional thermoelectric module, i.e., a thermoelectric module in which all thermoelectric elements are connected in series, is used in the comparative example, and the experimental example is set to a case of operating only the first current path among the first current path (e.g., the current path formed in sector A) and the second current path (e.g., the current path formed in sector B) divided into two subareas as shown in FIG. 7.

Following Table shows the temperature of the cold air and the outside temperature when the applied power is 6V and 4.8 A (i.e., 28.8 W), and the sector A is only operated.

|  | Temperature(° C.) | Outside Temperature(° C.) |
|---|---|---|
| Operating only sector A | 18(ΔT: −4.1) | 22.1 |

In addition, when the same voltage (e.g., 6V) and current (e.g., 4.8 A) are applied, in the comparative example (e.g., when both the two current paths normally operate), the temperature of the cold air is 16.8° C. when the outside temperature is 22.1° C. Thus, there is the temperature difference of 5.3° C. (i.e., 22.1° C.−16.8° C.) between the temperature of the cold air and the outside temperature.

In addition, in the experimental example (e.g., when only the first current path normally operates), the cold air is measured to be 18° C. when the outside temperature is 22.1° C. Thus, there is the temperature difference of 4.1° C. (i.e., 22.1° C.−18° C.) between the temperature of the cold air and the outside temperature, in the same environment.

In the case of the parallel thermoelectric module 100, it may be understood that performance of about 78% can be maintained, rather than the performance is reduced to about 50%, by operating only about half of the thermoelectric element groups.

In addition, compared with the comparative example in which the whole thermoelectric module does not operate although only one thermoelectric element is defective as there is only one current path in the thermoelectric module, the parallel thermoelectric module according to the exemplary embodiment remarkably improves the performance.

On the other hand, according to the exemplary embodiment, the parallel thermoelectric module 100 may have a plurality of parallel circuit units, and the plurality of parallel circuit units may be connected to each other in series.

For example, although FIGS. 1, 2, 3, 4, 5, 6, and 7 show a case in which one parallel circuit having two current paths is formed in the parallel thermoelectric module 100, N parallel circuits may be formed in the parallel thermoelectric module 100, and in this case, there may be a further higher performance improvement (i.e., a degree of degradation in performance when a certain thermoelectric element is defective).

Exemplary embodiments will be described with reference to FIGS. 8 to 14.

Figure 8:
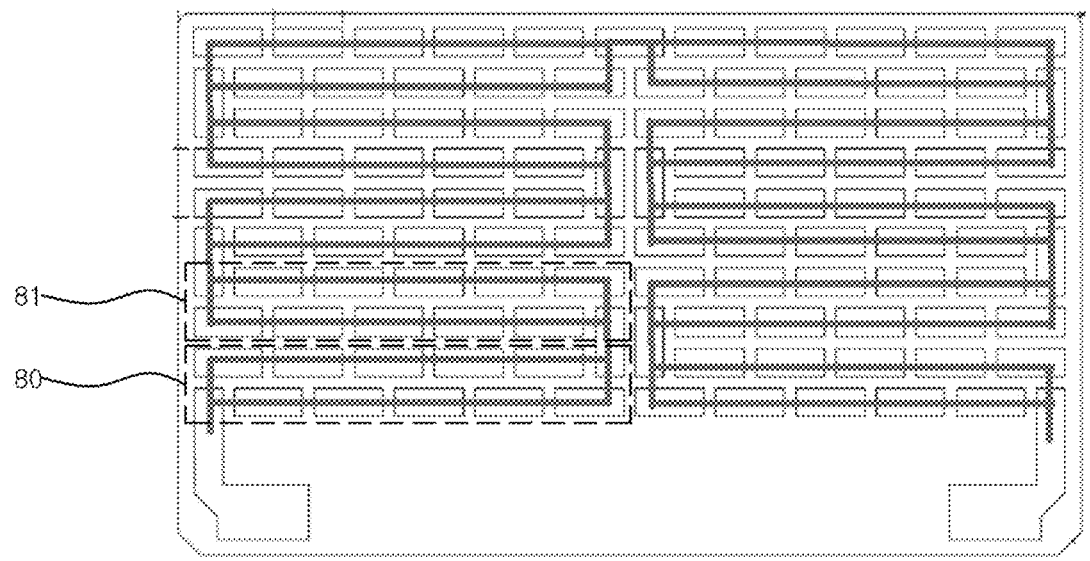
FIG. 8 is a plan view of an example of a thermoelectric module having a plurality of parallel circuits connected in series according to an exemplary embodiment.

FIG. 8 is a plan view showing an example of a thermoelectric module having a plurality of parallel circuits connected in series according to an exemplary embodiment.

Referring to FIG. 8, the parallel thermoelectric module 100 according to the exemplary embodiment may have a plurality of parallel circuit units 80 and 81 as shown in FIG. 8.

In FIG. 8, a total of ten parallel circuit units exist, and an example of connecting the parallel circuit units to each other in series is shown.

Each of the parallel circuit units 80, 81 and the like has a plurality of current paths.

Accordingly, in the parallel thermoelectric module 100 shown in FIG. 8, the number of thermoelectric elements that do not operate when a certain thermoelectric element is defective, i.e., the number of thermoelectric elements included in the current path including the defective thermoelectric element, is relatively much smaller than that of the case shown in FIG. 1.

For example, in the parallel thermoelectric module 100 shown in FIG. 8, since the number of thermoelectric elements included in any one current path is much smaller than that shown in FIG. 1, there is an effect of greatly lowering the performance degradation although a fault occurs in a certain thermoelectric element and a certain current path does not operate.

On the other hand, when a plurality of parallel circuit units 80 and 81 exists and the parallel circuit units 80 and 81 are connected to each other in series, there may exist a risk point. In this specification, the risk point means a part that does not allow operation of the entire thermoelectric module when a defect exists. For example, when a metal electrode or a thermoelectric element, since it is general that there is no case in which current does not flow as the metal electrode is defective, it will be described mainly focusing on the thermoelectric element in this specification.

The risk point like this may be a part connecting two parallel circuit units 80 and 81 in series, and will be described with reference to FIGS. 9 and 10A and 10B.

Figure 9:
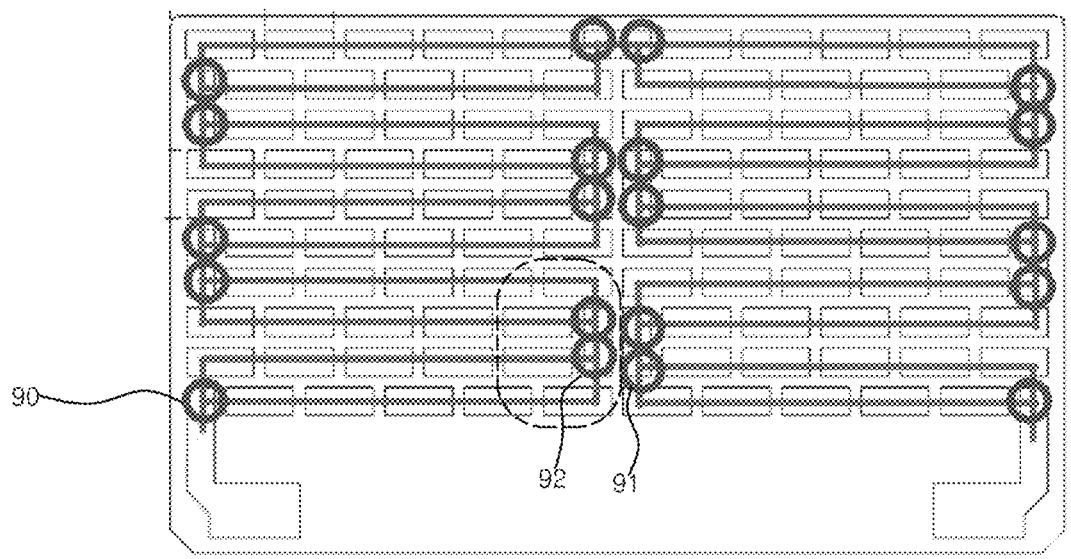
FIG. 9 is a plan view illustrating a risk point in the thermoelectric module of FIG. 8.
Figure 10A:
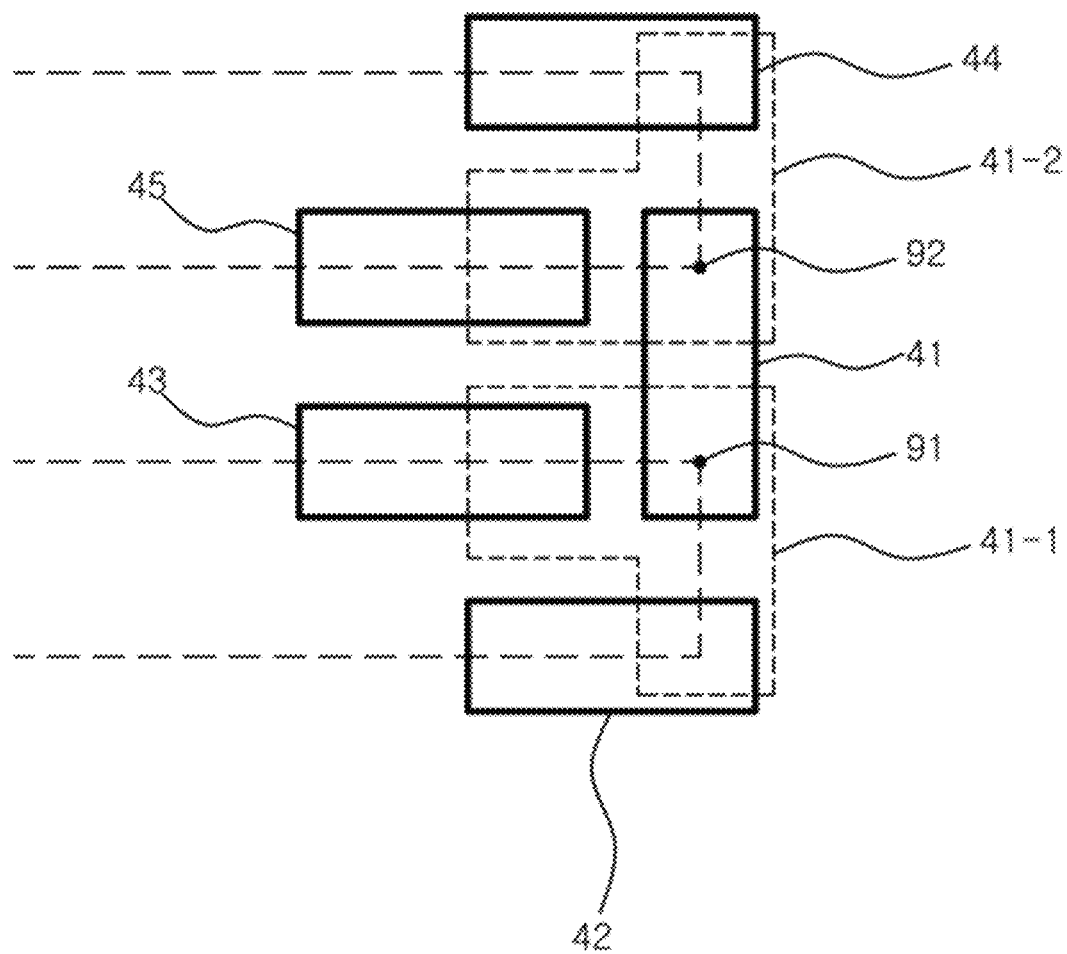
FIGS. 10A and 10B are enlarged views of a portion of FIG. 9.
Figure 10B:
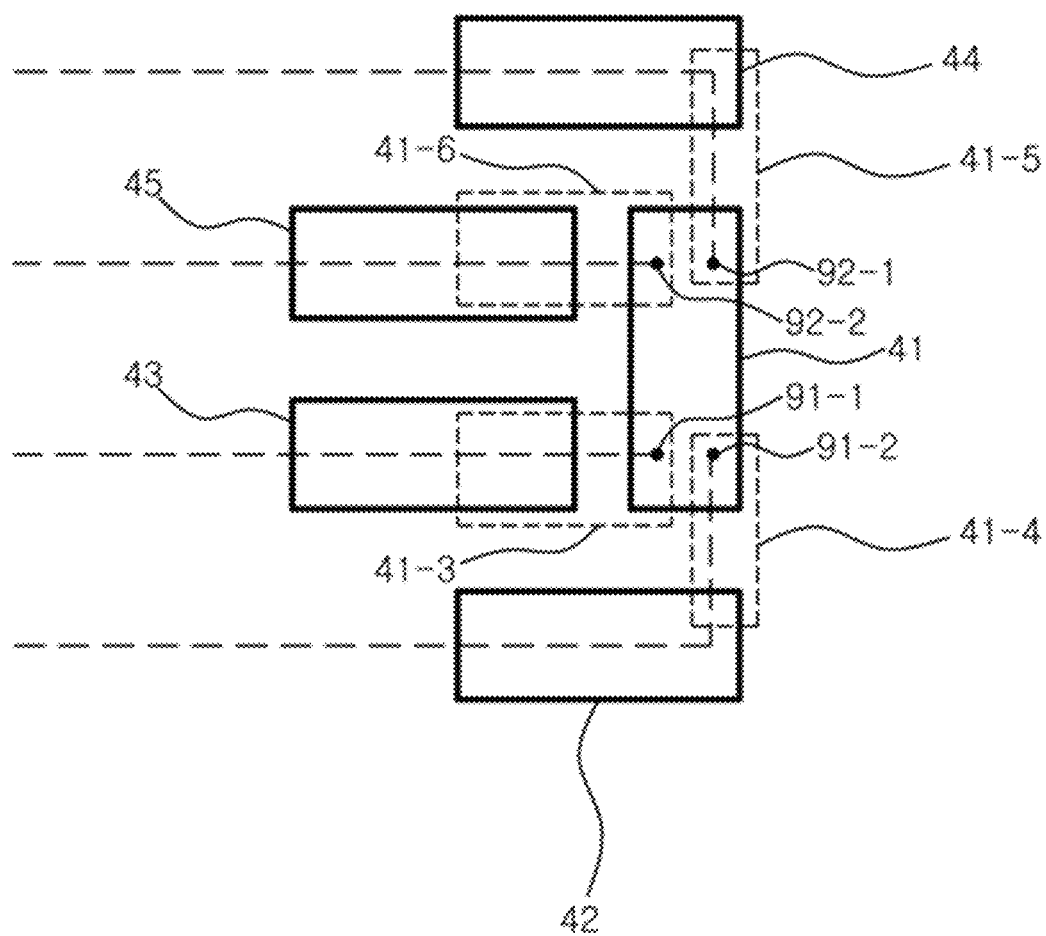

FIG. 9 is a plan view showing a risk point in the thermoelectric module shown in FIG. 8, and FIGS. 10A and 10B are enlarged views of a portion of FIG. 9.

Referring to FIGS. 8 to 10B, a first parallel circuit unit 80, which is any one of a plurality of parallel circuit units 80 and 81 included in the parallel thermoelectric module 100, and a second parallel circuit unit 81, which is another one of the parallel circuit units, may be connected in series as shown in the figure.

In addition, each of the first parallel circuit unit 80 and the second parallel circuit unit 81 may include a plurality of current paths.

For example, the first parallel circuit unit 80 may include current paths included in the first parallel circuit unit 80, and a common electrode 41 through which current flowing through each of the current paths commonly passes.

For example, both the first current path (e.g., the upper current path) and the second current path (e.g., the lower current path) included in the first parallel circuit unit 80 are connected to the common electrode 41.

In addition, the common electrode 41 may be a configuration for directly connecting the second parallel circuit unit 81 and the first parallel circuit unit 80.

In this case, when the common electrode 41 itself is disconnected or a thermoelectric element connected to the common electrode 41 (e.g., the thermoelectric element located at a point 91 or the thermoelectric element located at a point 92) is defective, the entire thermoelectric module may not operate.

Accordingly, the thermoelectric elements arranged at the point 91 and the point 92 and the common electrode 41 may be risk points. In addition, generally, the metal electrode is scarcely disconnected as described above, considering only the defect of the thermoelectric element, all the portions represented by circles in FIG. 9 may be risk points.

FIG. 10A is an enlarged view of a portion where a risk point like this exists. For example, although FIG. 10A shows a case in which the first parallel circuit unit 80 and the second parallel circuit unit 81 are directly connected through one common electrode 41, a plurality of metal electrodes may be arranged between the first parallel circuit unit 80 and the second parallel circuit unit 81. However, in this case, there is a disadvantage in that the number of risk points corresponding to the first parallel circuit unit 80 and the second parallel circuit unit 81 increases.

Since the common electrode 41 is commonly connected to the current paths of the second parallel circuit unit 81 (e.g., the upper current path is expressed as a third current path, and the lower current path is expressed as a fourth current path), the common electrode 41 may be the common electrode 41 of the first parallel circuit unit 80 and the common electrode 41 of the second parallel circuit unit 81.

Then, the first current path (e.g., the upper current path) of the first parallel circuit unit 80 includes the common electrode 41 and a first immediately-before homogeneous electrode (e.g., when the common electrode 41 is the first electrode, a first electrode 43 immediately before the common electrode 41 on the current path) arranged immediately before the common electrode 41, and the common electrode 41 and the first immediately-before homogeneous electrode 43 may be connected through a first immediately-before heterogeneous electrode (e.g., when the common electrode 41 is the first electrode, a second electrode 41-1 immediately before the common electrode 41 on the current path).

Similarly, the second current path (e.g., the lower current path) of the first parallel circuit unit 80 includes the common electrode 41 and a second immediately-before homogeneous electrode 42 arranged immediately before the common electrode 41, and the common electrode 41 and the second immediately-before homogeneous electrode 42 may be connected through a second immediately-before heterogeneous electrode 41-1.

At this point, although FIG. 10A shows a case in which the first immediately-before heterogeneous electrode and the second immediately-before heterogeneous electrode are implemented as one electrode, separate electrodes may be separately implemented as shown in FIG. 10B. For example, the first immediately-before heterogeneous electrode and the second immediately-before heterogeneous electrode, which are separately implemented, may be directly connected to contact each other.

In the case of implementing the first immediately-before heterogeneous electrode and the second immediately-before heterogeneous electrode as one and the same electrode as shown in FIG. 10, or in the case of separately implementing the electrodes to contact with each other, the first immediately-before heterogeneous electrode and the second immediately-before heterogeneous electrode may be connected to the common electrode 41 through one thermoelectric element (e.g., the thermoelectric element arranged at the point 91). In this case, when the thermoelectric element (e.g., the thermoelectric element arranged at the point 91) is defective, there is a risk in that the entire thermoelectric module does not operate.

Similarly, in the second parallel circuit unit 81, the third current path (e.g., the upper current path) includes a common electrode 41, a first immediately-after homogeneous electrode 44 of the common electrode 41 (a homogeneous electrode existing immediately after the common electrode 41 on the current path), and a first immediately-after heterogeneous electrode 41-2 connecting the common electrode 41 and the first immediately-after homogeneous electrode 44.

In addition, the fourth current path (e.g., the lower current path) of the second parallel circuit unit 81 includes a common electrode 41, a second immediately-after homogeneous electrode 45 of the common electrode 41, and a second immediately-after heterogeneous electrode 41-2 connecting the common electrode 41 and the second immediately-after homogeneous electrode 45.

In addition, also in this case, the first immediately-after heterogeneous electrode and the second immediately-after heterogeneous electrode may be connected to the common electrode 41 through one thermoelectric element (e.g., the thermoelectric element arranged at the point 92).

Accordingly, the point 91 and the point 92 may be risk points.

The circuit as shown in FIG. 10B may be formed to prevent a fault occurring at these risk points.

As shown in FIG. 10B, the first parallel circuit unit 80 may be implemented to connect the common electrode 41 to the first immediately-before heterogeneous electrode 41-3 and the second immediately-before heterogeneous electrode 41-4 through different thermoelectric elements (e.g., the thermoelectric elements arranged at points 91-1 and 91-2).

In this case, although a fault occurs in any one of a predetermined first thermoelectric element (e.g., the thermoelectric element arranged at the point 91-1) connecting the first immediately-before heterogeneous electrode 41-3 and the common electrode 41 and a predetermined second thermoelectric element (e.g., the thermoelectric element arranged at the points 91-2) connecting the second immediately-before heterogeneous electrode 41-4 and the common electrode 41, and therefore, any one of the first current path and the second current path does not operate, the other current path normally operates.

Similarly, the second parallel circuit unit 81 may also be implemented to connect the common electrode 41 to the first immediately-after heterogeneous electrode 41-5 and the second immediately-after heterogeneous electrode 41-6 through different thermoelectric elements (e.g., the thermoelectric elements arranged at points 92-1 and 92-2).

In this case, although a fault occurs in any one of a predetermined third thermoelectric element (e.g., the thermoelectric element arranged at the point 92-1) connecting the first immediately-after heterogeneous electrode 41-5 and the common electrode 41 and a predetermined fourth thermoelectric element (e.g., the thermoelectric element arranged at the point 92-2) connecting the second immediately-after heterogeneous electrode 41-6 and the common electrode 41, and any one of the third current path and the fourth current path does not operate, the other current path normally operates.

When the first parallel circuit unit 80 and the second parallel circuit unit 81 are connected in series through a plurality of metal electrodes as described above, the common electrode of the first parallel circuit unit 80 and the common electrode of the second parallel circuit unit 81 may be different metal electrodes. In this case, it may be implemented to connect the common electrode of the first parallel circuit unit 80 to the first immediately-before heterogeneous electrode 41-3 and the second immediately-before heterogeneous electrode 41-4 through two different thermoelectric elements (e.g., the thermoelectric elements arranged at the points 91-1 and 91-2), and it may be implemented to connect the common electrode of the second parallel circuit unit 81 to the first immediately-after heterogeneous electrode 41-5 and the second immediately-after heterogeneous electrode 41-6 through different thermoelectric elements (e.g., the thermoelectric elements arranged at the points 92-1 and 92-2).

According to another exemplary embodiment, connecting a plurality of parallel circuit units in series will be described with reference to FIGS. 12 and 13.

Figure 12:
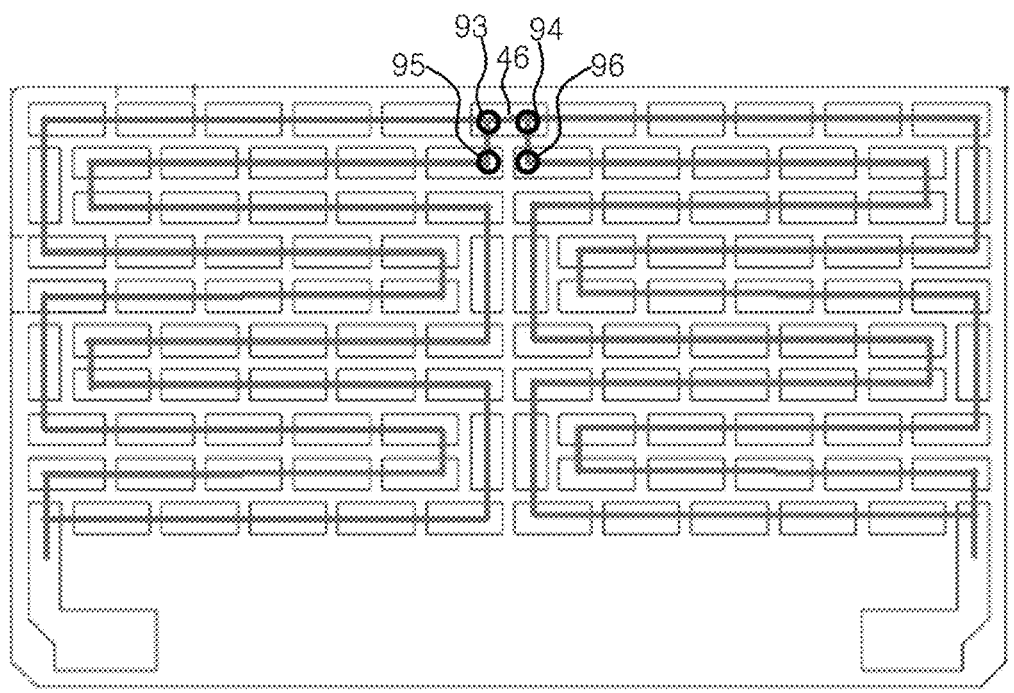
FIG. 12 is a plan view of another exemplary embodiment of the parallel thermoelectric module of FIG. 1.
Figure 13:
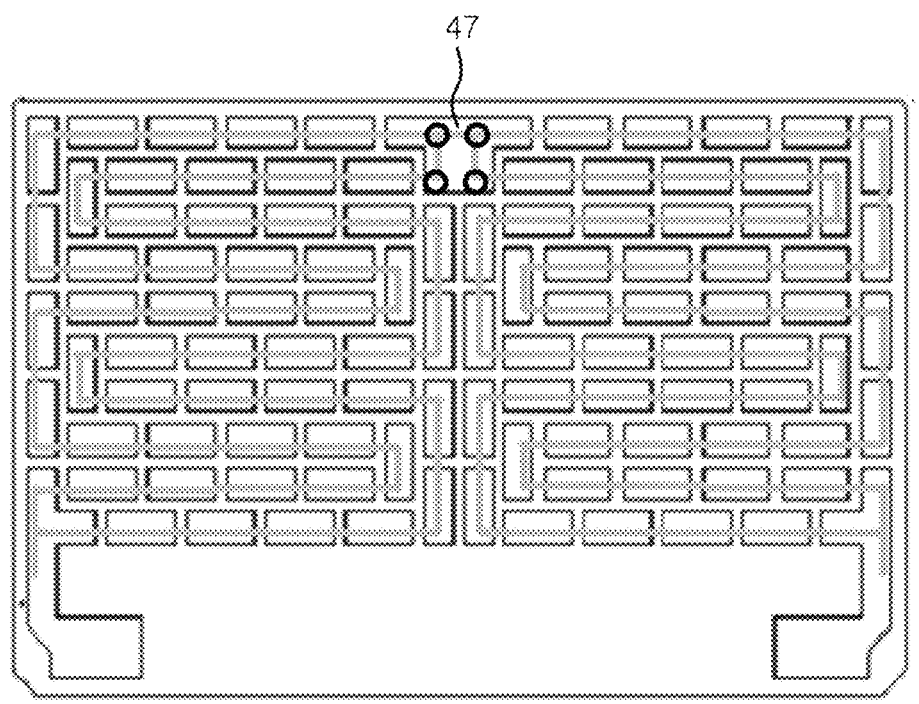
FIG. 13 is a plan view illustrating a common electrode of another exemplary embodiment of the parallel thermoelectric module of FIG. 1.

FIG. 12 is a plan view of another exemplary embodiment of the parallel thermoelectric module of FIG. 1, and FIG. 13 is a plan view illustrating a common electrode of another exemplary embodiment of the parallel thermoelectric module of FIG. 1.

FIG. 12 shows an example of connecting two parallel circuit units in series.

In addition, in this case, risk points 93, 94, 95, and 96 may exist as shown in FIG. 12.

It also shows an example of connecting two parallel circuit units in series by one common electrode 46.

In this case, a common electrode 47 may be implemented as shown in FIG. 13 to reduce the risk points.

For example, as shown in FIG. 10B, each of the current paths of the first parallel circuit unit (e.g., the parallel circuit unit on the left side) connected in series through the common electrode 47 is connected to the common electrode 47 through separate thermoelectric elements, and in addition, each of the current paths of the second parallel circuit unit (e.g., the parallel circuit unit on the right side) may also be connected to the common electrode 47 through separate thermoelectric elements.

In this case, as many different connecting contact points (e.g., thermoelectric elements) as the number of current paths of each of the parallel circuit units connected through the common electrode 47 may exist in the common electrode 47.

For example, although it is described in the examples described above that a thermoelectric element connects the common electrode and the immediately-before (or immediately-after) heterogeneous electrode as an example, a conductor, not the thermoelectric element, may be fixedly coupled.

In addition, according to another example, the common electrode and the immediately-before (or immediately-after) homogeneous electrode may be directly connected through a conductor without providing an immediately-before (or immediately-after) heterogeneous electrode.

However, exemplary embodiments are not limited thereto. For example, the risk points may be reduced in various ways.

FIG. 11 is a table showing a performance of an experimental example of the thermoelectric module shown in FIG. 8, and FIG. 14 is a table showing a performance of an experimental example of the thermoelectric module shown in FIG. 12.

First, in FIGS. 11 and 14, Z denotes a thermoelectric figure of merit of a thermoelectric module, R denotes resistance of a thermoelectric module, V denotes an applied voltage, I denotes current consumption, W denotes power consumption, and Cool denotes temperature of cold air discharged from a vehicle seat cooling system to which the thermoelectric module is applied, Ta denotes temperature of outside air, and ΔT denotes difference of temperature between outside air and cold air.

In addition, a series thermoelectric element means a thermoelectric module connecting all thermoelectric elements in series as shown in the prior art.

In an exemplary embodiment, there may be two hundred and twenty thermoelectric elements that operate when there is no fault in the thermoelectric module shown in FIG. 8. In addition, when any one thermoelectric element included in any one parallel circuit unit is defective, the thermoelectric elements included in the current path including the defective thermoelectric element may not operate, and at this point, there may be two hundred and ten thermoelectric elements that normally operate.

For example, when the applied voltage is 5 V, and all the thermoelectric elements normally operate, ΔT is −4.9, whereas when any one current path included in any one parallel circuit unit does not operate, ΔT is −4.8.

In addition, when the applied voltage is 3 V, and all the thermoelectric elements normally operate, ΔT is −4.5, whereas when any one current path included in any one parallel circuit unit does not operate, ΔT is −4.4.

As a result of an experiment conducted while changing the voltage applied to the thermoelectric module, as shown in FIG. 11, there is almost no difference in ΔT compared with the case where all the thermoelectric elements normally operate.

Meanwhile, FIG. 14 shows a result of an experiment conducted for the thermoelectric module as shown in FIG. 13 according to another exemplary embodiment, and when there is no fault, there may be two hundred and twenty thermoelectric elements that operate. In addition, when any one thermoelectric element included in any one the parallel circuit unit is defective, the thermoelectric elements included in the current path including the defective thermoelectric element may not operate, and at this point, there may be one hundred and sixty-six thermoelectric elements that normally operate.

In this case, as a result of an experiment conducted while changing the voltage applied to the thermoelectric module, when the applied voltage is 4 V, ΔT (i.e., −5.8) of the thermoelectric module according to an exemplary embodiment shows further excellent performance compared with ΔT (i.e., −5.1) of the conventional series thermoelectric module.

In addition, when the applied voltage is 4 V, as shown in FIG. 14, performance degradation of ΔT (i.e., −4.6) is about 0.5 degrees, which is only about 10%, when any one of the current paths included in any one parallel circuit unit does not operate, compared with ΔT (i.e., −5.1) of the conventional series thermoelectric module in which all the thermoelectric elements normally operate.

In addition, performance degradation of ΔT (i.e., −4.6) is about 1.2 degrees, which is only about 20%, when any one of the current paths included in any one parallel circuit unit does not operate, compared with ΔT (i.e., −5.8) of a case where all the thermoelectric elements operate according to the exemplary embodiment, and it is understood that actual degradation of performance is lower than 25%, which is the ratio of thermoelectric elements that do not operate.

The illustrated exemplary embodiments may be used in a parallel thermoelectric module.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A parallel thermoelectric module comprising:
    a first substrate and a second substrate arranged to be spaced apart from each other;
    a plurality of first electrodes disposed on the first substrate;
    a plurality of second electrodes disposed on the second substrate;
    thermoelectric elements disposed on the first substrate and the second substrate to connect one of the first electrodes to one of the second electrodes, the thermoelectric elements comprising a plurality of N-type thermoelectric elements and a plurality of P-type thermoelectric elements, wherein a plurality of the thermoelectric elements are disposed at risk points in the parallel thermoelectric module;
    electrode terminals including at least one positive electrode terminal and at least one negative electrode terminal disposed on at least one of the first and second substrates; and
    a first parallel circuit unit including a first homogeneous electrode connected to a second homogeneous electrode through a first heterogeneous electrode; and
    a second parallel circuit unit including a third homogeneous electrode connected to a fourth homogeneous electrode through a second heterogeneous electrode, wherein the first heterogeneous electrode of the first parallel circuit is connected in series with the second heterogeneous electrode of the second parallel circuit through a common electrode, each of the first and second parallel circuit units having a parallel circuit structure, and each of the first and second parallel circuit units including a plurality of risk points, wherein:

the plurality of first electrodes, the plurality of second electrodes, and the thermoelectric elements are arranged to connect the first and second parallel circuit units; and the common electrode is connected to a first plurality of risk points in the first parallel circuit unit and the common electrode is connected to a second plurality of risk points in the second parallel circuit unit such that current flows from the first parallel circuit unit and the second parallel circuit unit when a fault occurs in one of the thermoelectric elements.

2. The module of claim 1, wherein:

at least one of the first electrodes, at least one of the second electrodes, and at least one thermoelectric element are provided in each of current paths formed by the first and second parallel circuit units, and current sequentially flows through the at least one first electrode, the at least one thermoelectric element, and the at least one second electrode when power is applied through the electrode terminals.

3. The module of claim 2, wherein current flowing through each of the current paths commonly passes through the common electrode.

4. The module of claim 3, wherein the second parallel circuit unit connected to the first parallel circuit unit in series is directly connected through the common electrode.

5. The module of claim 3, wherein:

the first heterogeneous electrode connects the common electrode to the first homogeneous electrode and the second homogeneous electrode;

the second heterogeneous electrode connects the common electrode to the third homogeneous electrode and the fourth homogeneous electrode; and each of the first heterogeneous electrode and the second heterogeneous electrode comprise one electrode or two separate electrodes connected to each other.

6. The module of claim 5, wherein each of the first heterogeneous electrode and the second heterogeneous electrode is connected to the common electrode through one thermoelectric element.

7. The module of claim 1, wherein:

the common electrode is connected to at least two second electrodes of the first parallel circuit unit and at least two second electrodes of the second parallel circuit unit, and the at least two second electrodes of the first parallel circuit unit are connected to the common electrode through a first N-type thermoelectric element and a first P-type thermoelectric element, respectively.

8. The module of claim 7, wherein the at least two second electrodes of the second parallel circuit unit are connected to the common electrode through a second N-type thermoelectric element and a second P-type thermoelectric element, respectively.

* * * * *